United States Patent [19]

Kuhlmann

[11] 4,430,617

[45] Feb. 7, 1984

[54] CLOCK GENERATOR

[75] Inventor: Joachim Kuhlmann, Heilbronn, Fed. Rep. of Germany

[73] Assignee: TELEFUNKEN electronic GmbH, Heilbronn, Fed. Rep. of Germany

[21] Appl. No.: 326,923

[22] Filed: Dec. 2, 1981

[30] Foreign Application Priority Data

Dec. 12, 1980 [DE] Fed. Rep. of Germany ....... 3046772

[51] Int. Cl.$^3$ ...................... H03K 3/78; H03K 3/017; H03K 3/86
[52] U.S. Cl. ......................................... 328/61; 307/269
[58] Field of Search ........................... 328/61; 307/269

[56] References Cited

U.S. PATENT DOCUMENTS 3,657,658 4/1972 Kubo .................................... 328/61
4,109,210 8/1978 Gerlach et al. .
4,296,380 10/1981 Minakuchi ............................ 328/61
4,344,036 8/1982 Dakroub et al. ..................... 328/61

FOREIGN PATENT DOCUMENTS 1219983 6/1966 Fed. Rep. of Germany .
1273576 7/1968 Fed. Rep. of Germany .

OTHER PUBLICATIONS

Trump et al., "A Logarithmic Time Base Generator or Counter", Rev. Sci. Instrum., vol. 45, No. 5, May 1974, pp. 714–716.

Primary Examiner—John S. Heyman
Attorney, Agent, or Firm—Spencer & Frank

[57] ABSTRACT

A clock signal generator comprises a counter, a shift register and a logic circuit, the generator receiving a clock input signal of constant period and producing a clock output signal of which the period increases according to a geometrical ratio, within each shift cycle of the shift register.

5 Claims, 2 Drawing Figures

CLOCK GENERATOR

BACKGROUND OF THE INVENTION

In many cases clock generators are required in data processing and produce individual successive pulses which can be used to store, interrogate and pass on information or instructions for example. In the case of digital to analogue converters, in many cases there are certain values, for example those of electrical magnitudes, which are stored digitally in shift registers and are converted with the aid of an integrated element connected to the shift register into analogue values. Clock generators ensure that the content of the shift register can be altered, fed out and kept in continuous circulation.

Clock generators generating clock pulses of constant frequency are usually used in data processing. A digital to analogue converter is described in German Patent Specification No. 2348831, which contains a shift register in which the digital value of a magnitude is stored. The shift register content circulates continuously through a data loop and can be altered by a logic unit inserted into the data loop. In this known digital to analogue converter, a DC voltage is derived from an integrating element connected to the shift register, said DC voltage being directly proportional to the number of logical "1" instructions in the shift register. Since the shift clock timing pulses have a constant frequency the divisibility of the magnitude which can be derived by the integrator depends only on the length of the shift register and the number of binary instructions which are to be housed in the shift register in this known digital to analogue converter. In a shift register having n equivalent stages, n different digital values can be accommodated. The resolution of the digitally detected magnitude which is output in analogue form is therefore 1/n.

SUMMARY OF THE INVENTION

An object underlying the invention is to provide a clock generator which makes it possible to make better use of the available logic components i.e. which makes it possible to process more information or to accelerate the flow of information.

According to the invention there is provided a clock signal generator comprising a counter, a circulating shift register having a period of circulation, and a logic circuit connected to said counter and said shift register, said logic circuit having an output providing an output clock signal, and within each said period of circulation of said shift register, the period of said output clock signal increasing according to a geometric ratio.

Further according to the invention there is provided a clock generator comprising a binary counter, a shift register having a complete shift interval, and a logic circuit connecting said counter and said register, said logic circuit having an output providing an output clock signal with a period which increases in a binary manner within one complete shift interval of said shift register.

BRIEF DESCRIPTION OF THE DRAWINGS

The invention will now be described in greater detail, by way of example, with reference to the drawings of which.

DESCRIPTION OF THE PREFERRED EMBODIMENT

Figure 1:
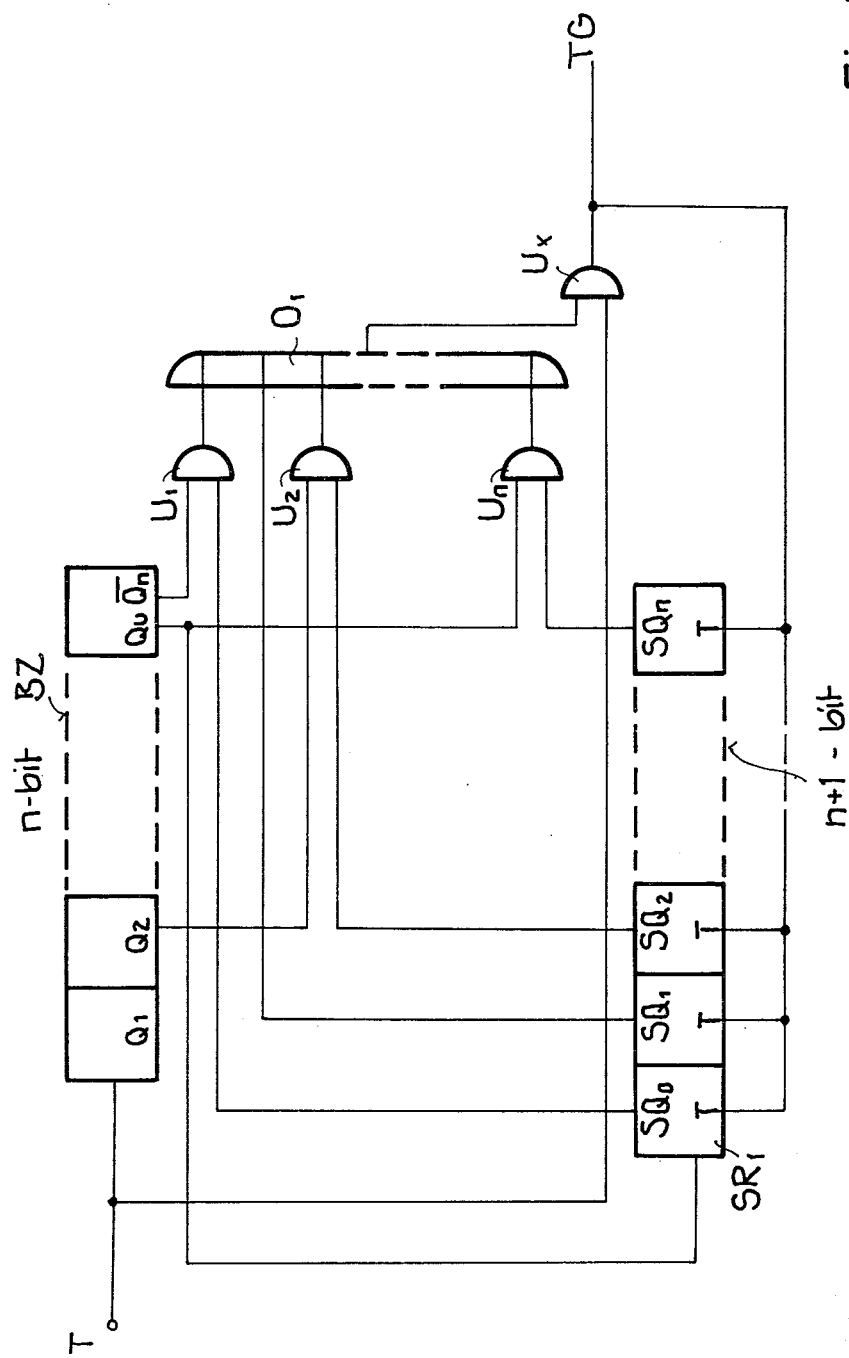
FIG. 1 shows a clock generator according to the present invention.

Basically the present invention provides a counter and shift register interconnected by means of a logic circuit such that within each complete shift interval of the shift register, an output clock signal with a period which increases in geometric manner appears at the output of the logic circuit.

Thus there may be provided a clock generator which has periods which increase in binary form instead of clock pulses with constant periods. In this case, the maximum period is $2^n$ times the period of the first clock pulse when n is the number of stages of the binary counter. If this type of clock timing signal, which is generally of pulsed form, is passed to the shift register of a digital to analogue converter, then individual stages of the shift register are given a weighting due to the fact that the content of each respective stage is applied to the following integrated element for 1,2,4,8 or $2^n$ times as long as compared to the length of the basic clock signal. In view of this weighting of the content of succeeding stages in the shift register of a digital to analogue converter when using a clock generator with a period which increases in binary form, $2^n+1$ analogue values can be stored in the n+1 stage shift register of the digital to analogue converter.

In a preferred arrangement the output clock signal with the period which increases in binary form is also the shift clock signal of the shift register contained in the clock generator. In each case one stage of the shift register contains a logic signal which is different from the content of all of the other stages of the shift register. This means that only one stage of the shift register for example contains a logical "1".

In an advantageous refinement of the clock generator in accordance with the invention, a basic clock signal with individual timing pulses of constant period is applied to the input of an n-stage binary counter. The shift register of the clock generator has n+1 stages and the individual stages of the shift register and of the binary counter are linked via the logic circuit so that there appears at the output of the logic circuit, an output clock signal with a period which increases in binary form during one circulation or cycle of the shift register and therefore with a period ratio as compared to the basic clock signal of 1:1:2:4:8 . . . $2^n$ for example.

The logic circuit or unit preferably comprises an OR gate with n+1 inputs, n inputs being formed from the outputs of AND gates. These AND gates each link one stage of the binary counter to a corresponding stage of the shift register. The content of a specific stage of the shift register is applied directly to the n+1th input of the OR gate so that there is a fixed synchronization of the clock sequence within one circulation or cycle of the shift register. A last AND gate links the output of the OR gate to the basic clock signal. Therefore the output clock signal with the period which increases in binary form appears at the output of this AND gate.

The logic unit described below also contains a first AND gate which links the inverted content of the last stage of the binary counter with the content of the first shift register stage.

Figure 2:
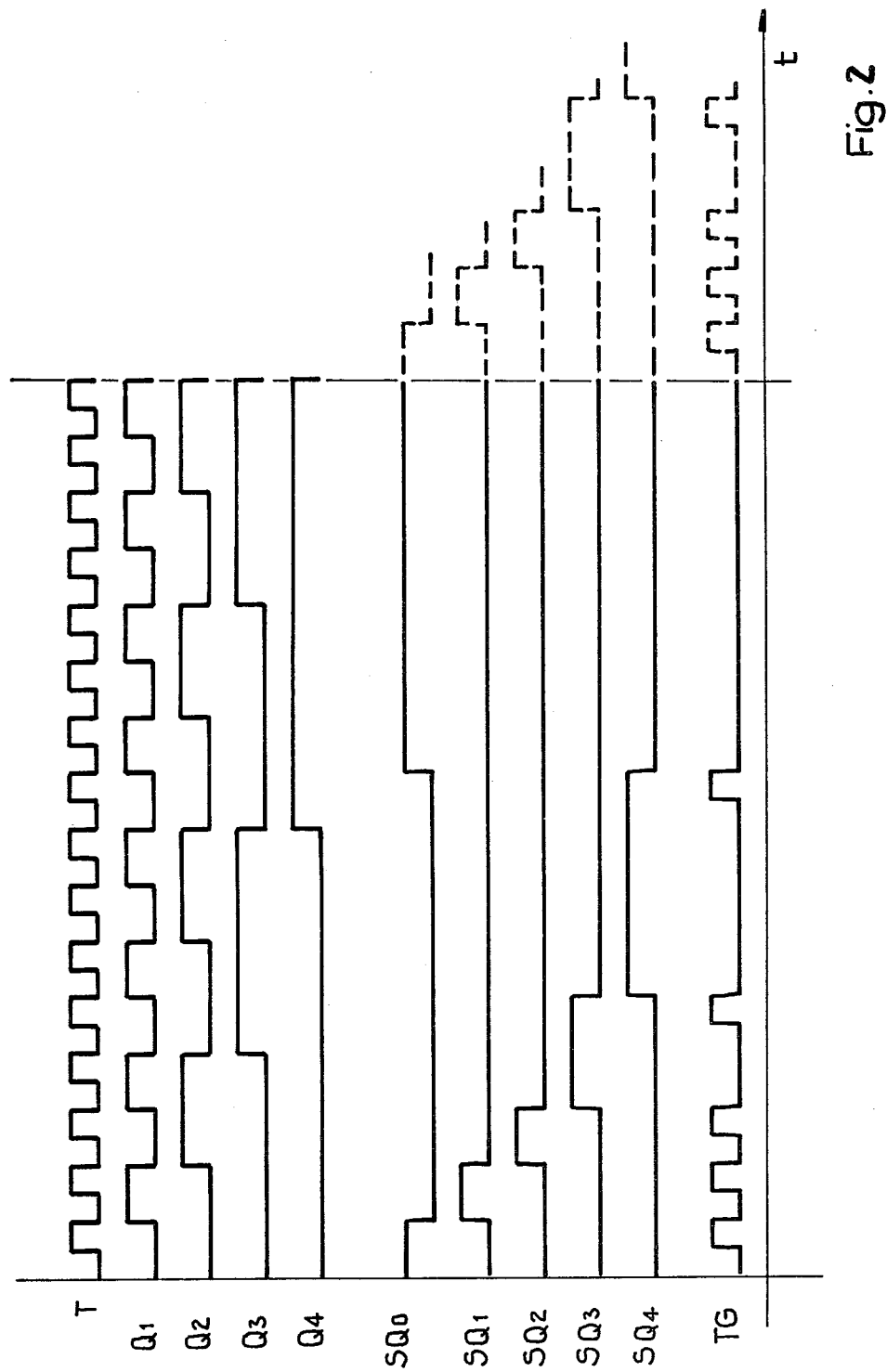
FIG. 2 shows the signal content of parts of the clock generator of FIG. 1, the pulse diagrams being based, solely by way of example, on a four stage (n=4) counter.

Referring now to the drawings, FIG. 1 shows a binary counter BZ comprising n stages with a clock pulse T which has constant frequency in accordance with the first diagram of FIG. 2 applied to the input of the said binary counter. The counter itself may be a conventional binary counter comprising flip-flops and therefore need not be described in greater detail. As can be seen from the diagram of FIG. 2 the frequency of the basic cycle is divided in the stage $Q_1$. A further frequency division takes place in stage $Q_2$ and further frequency division resulting from the binary code is carried out by the subsequent stages of the binary counter. In the diagrams of FIG. 2 the resultant pulse code is shown in the individual stages of the binary counter. Stage $Q_1$ of the binary counter therefore has a binary weighting of $2^0$, stage $Q_2$ has a binary weighting $2^1$, stage $Q_3$ has a binary value $2^2$ and stage $Q_4$ has a binary value $2^3$. A 4 stage binary counter of the type shown in FIG. 2 is able to add 15 clock pulses of the basic clock signal T.

The clock generator according to FIG. 1 also includes a shift register $SR_1$, with n+1 stages which are designated $SQ_0$ to $SQ_n$. The logic unit which links the binary counter and the shift register comprises the OR gate $O_1$ and AND gates $U_1$ to $U_n$. All of the outputs of these AND gates are also inputs of the OR gate. The AND gate $U_1$ links the inverted content of the last binary counter stage $Q_n$ with the content of the first shift register stage $SQ_0$. The content of the shift register $SQ_1$ which follows on from stage $SQ_0$ represents a synchronising stage so that the content of this stage passes direct to the OR gate $O_1$ as an input information signal. All of the subsequent AND gates are linked respectively to a binary counter stage with a shift register stage of the same counting sequence. Consequently the AND gate $U_2$ links the binary counter stage $Q_2$ with the shift register stage $SQ_2$.

A last AND gate $U_x$ links the output of the OR gate $O_1$ with the basic time signal T. The timing pulse TG, which has a period which increases in binary form, appears at the output of this AND gate $U_x$ which is supplied back to the shift register stages at the same time as a shift clock pulse. The logic units therefore perform the logic linking shown below.

$$TG = (\overline{Q_n} \times SQ_0 + SQ_1 + Q_2 \times SQ_2 + \ldots Q_n \times SQ_n) \times T.$$

The result of this logic linking is apparent from FIG. 2.

As stated above, in each case one stage in the shift register $SR_1$ has a logical "1" information signal. This information signal is located—as shown—in the shift register stage $SQ_1$ for example. Since this shift register stage forms a direct input of the OR gate, a clock pulse may occur at the output of the AND gate $U_x$ if the basic time signal T is applied to this AND gate $U_x$. The resultant clock pulse at the input TG shifts the information signal of cell $SQ_1$ into cell $SQ_2$. The shift register stage $SQ_2$ is linked to the binary counter stage $Q_2$ so that a further clock pulse appears at the clock output TG if a further clock pulse T appears during the time when there is a logical "1" both in the shift register stage $SQ_2$ and in the binary counter stage $Q_2$. As a result the third separate pulse TG as shown in the diagram of FIG. 2 is provided and the logic signal "1" from the memory cell $SQ_2$ is shifted on by this separate pulse TG to $SQ_3$. The shift register stage $SQ_3$ is linked to the binary counter stage $Q_3$ via an AND gate. The binary counter stage $Q_3$ only takes the value "1" after the fourth basic cycle so that only the following fifth basic cycle appears at the output TG and the "1" instruction can be shifted out of the cell $SQ_3$ to the cell $SQ_4$. As a result a pulse of the basic cycle was lost in the clock sequence TG so that the period of the output clock TG has already doubled.

The shift register stage $SQ_4$ is connected to the binary counter stage $Q_4$ which only changes its information content after the eighth basic cycle. This means that only the ninth basic cycle can be output via the AND gate $U_x$ while the three basic clock pulses which have appeared during this time at the output TG are suppressed. The period of the currently appearing output pulse TG has also doubled. The "1" information in an assumed five stae shift register $SR_1$ and a four stage binary counter is shifted from the shift register stage $SQ_4$ to $SQ_0$ by the last output clock pulse TG which is shown in solid lines.

The shift register stage $SQ_0$ is linked via the AND gate $U_1$ to the inverted content of the last stage $Q_4$ of the binary counter so that a further clock pulse is only able to appear at the output TG when the binary counter stage $Q_4$ goes from the logical "1" information back to "0". This moment is indicated in FIG. 2 by a dashed line vertical to the time axis t. The first clock pulse T following this point in time appears at the output TG and is shown as a dashed pulse in the bottom line of the diagram. Its period has doubled again as compared to that of the preceding pulse. As it appears the "1" instruction is shifted out of the shift register $SQ_0$ to $SQ_1$ and the cycle which has been described above is repeated.

A clock pulse is produced by linking a binary counter and a shift register as described, the periods of the clock pulse rising in binary form between the individual clock pulses, i.e. in the ratio 1:1:2:4:8. This is true of a four stage binary counter and a five stage shift register unit. The number of stages can of course be increased as desired and this would then have a corresponding effect on the periods of succeeding clock pulses at the output of the clock generator.

The above described arrangement constitutes a clock generator in which the clock sequence already has a binary weighting so that the otherwise conventional weighting circuit in digital/analogue converters can be replaced. The binary weighting applies to one circulation or cycle of the shift register of the clock generator in each case and is repeated continually. Accordingly with subsequent elevation circuits all that is important is how the data content of successive memory stages are associated with the control clock pulse TG whose individual clock pulses have periods which increase in binary form. As already mentioned, with reference to a digital to analogue converter by way of example, the individual shift register stages of the digital/analogue converter are already provided with weighting as a result of the control carried out by the described clock pulse.

It will be understood that the above description of the present invention is susceptible to various modification changes and adaptations.

I claim:

1. A clock generator comprising: a binary counter having n-stages and an input to which is supplied a basic clock signal with separate timing pulses at a constant period; a shift register having a complete shift interval and n+1 stages; and a logic circuit having an output and linking the individual stages of said shift register and of said binary counter together so that a clock output signal, which has a period which increases in binary form during one complete shift interval of the shift register and a period ratio such as (1:1:2:4:8: . . . :2n) as compared to the basic clock signal, appears at said output of said logic circuit; and wherein said logic circuit has an OR gate an n+1 AND gates, said OR gate has n+1 inputs with n of said inputs being formed by the outputs of n of said AND gates, each of said n AND gates connects one stage of said binary counter with a corresponding stage of said shift register, the logic signal in one of said stages of said shift register is applied directly to the n+1th input of said OR gate, the n+1th AND gate has inputs connected to the output of said OR gate and to said basic clock signal, and said clock output signal appears at the output of said n+1th AND gate.

2. A clock generator as defined in claim 1 in which said shift register is shifted by a shift clock signal, and said output of said logic circuit provides said shift clock signal.

3. A clock generator as defined in claim 2 in which one of said stages of said shift register contains a logic signal which is different from the logic signal contained in the other stages of said shift register.

4. A clock generator as defined in claim 1 in which said period varies so that the period ratio between it and said constant period of said basic clock signal varies as 1:1:2:4:8: . . . 2n.

5. A clock generator as defined in claim 1 in which the inverted content of the nth stage of the said binary counter is combined with the content of the first shift register stage by means of a first of said n AND gates.

* * * * *